United States Patent
Zeller

(10) Patent No.: US 10,712,415 B2
(45) Date of Patent: Jul. 14, 2020

(54) METHOD AND APPARATUS FOR RECORDING MAGNETIC RESONANCE DATA

(71) Applicant: Siemens Healthcare GmbH, Erlangen (DE)

(72) Inventor: Mario Zeller, Erlangen (DE)

(73) Assignee: Siemens Healthcare GmbH, Erlangen (DE)

( * ) Notice: Subject to any disclaimer, the term of this patent is extended or adjusted under 35 U.S.C. 154(b) by 0 days.

(21) Appl. No.: 16/294,320

(22) Filed: Mar. 6, 2019

(65) Prior Publication Data

US 2019/0277932 A1 Sep. 12, 2019

(30) Foreign Application Priority Data

Mar. 6, 2018 (EP) ..................................... 18160242

(51) Int. Cl.
*G01R 33/56* (2006.01)
*G01R 33/483* (2006.01)
*G01R 33/561* (2006.01)

(52) U.S. Cl.
CPC ..... *G01R 33/5602* (2013.01); *G01R 33/4835* (2013.01); *G01R 33/5608* (2013.01); *G01R 33/5611* (2013.01); *G01R 33/5617* (2013.01)

(58) Field of Classification Search
CPC ............ G01R 33/5602; G01R 33/4835; G01R 33/5608; G01R 33/5611; G01R 33/5617
See application file for complete search history.

(56) References Cited

U.S. PATENT DOCUMENTS

2010/0329531 A1* 12/2010 Martinez-Moller ... A61B 6/032
382/131
2016/0299205 A1* 10/2016 Choi .................. G01R 33/4835

\* cited by examiner

*Primary Examiner* — Gregory H Curran
(74) *Attorney, Agent, or Firm* — Schiff Hardin LLP

(57) ABSTRACT

In a method and apparatus for recording a magnetic resonance data record in a capture region of an examination object, the capture region being composed of multiple slices, an imaging technique is implemented that uses reference data in the reconstruction of magnetic resonance images, wherein, for all the slices, at least two partial data records are recorded with respectively different contrasts. For thus purpose, a first partial data record is recorded without a preparation pulse and a second partial data record is recorded with a preparation pulse, in particular an inversion pulse. The reference data for at least one first slice for the first partial data record are recorded during a waiting time after the preparation pulse for at least one other, second slice, from which reference data relating to the second partial data record are to be recorded.

10 Claims, 3 Drawing Sheets

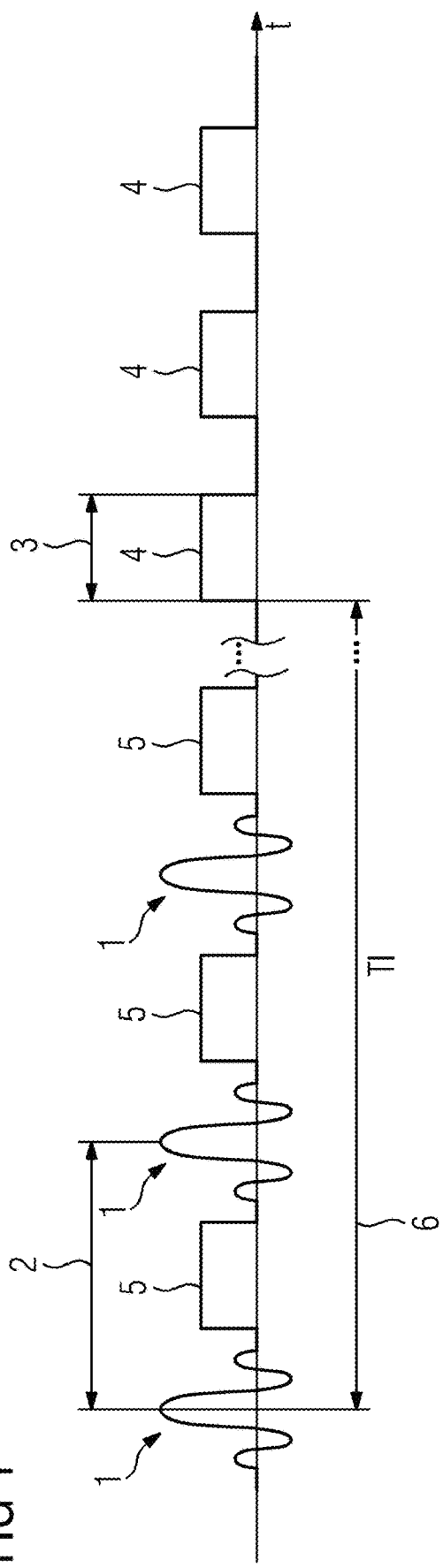
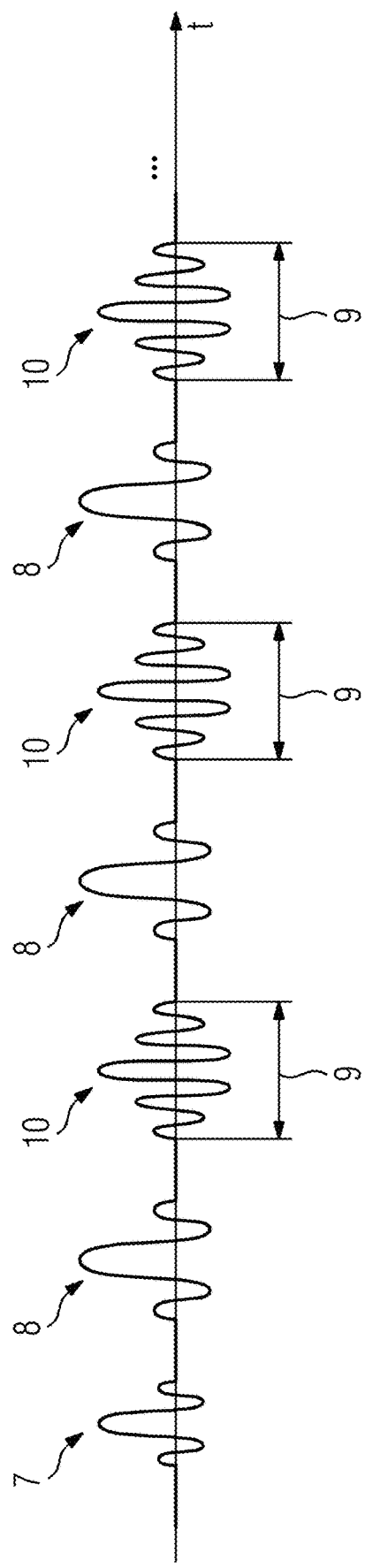

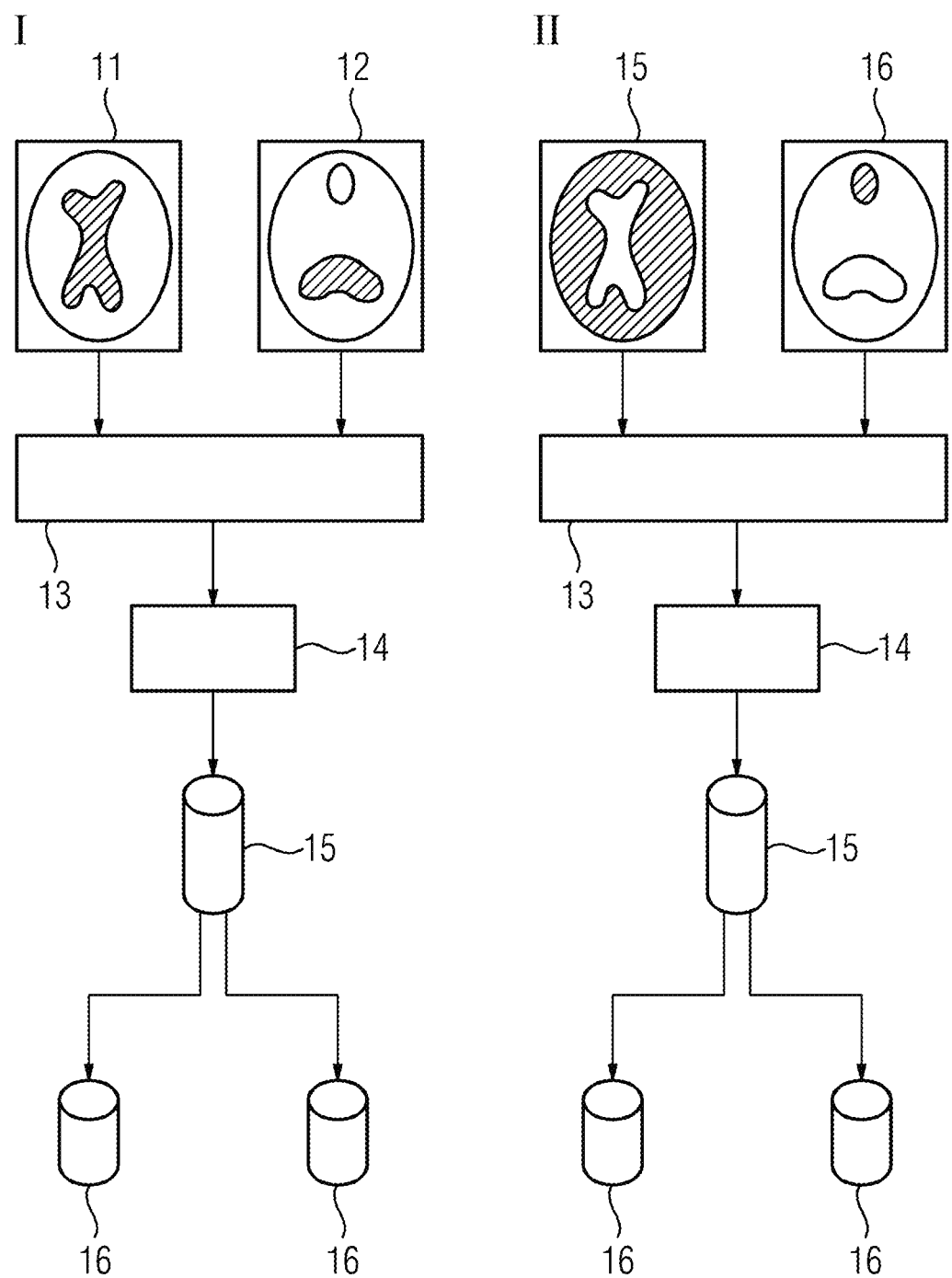

METHOD AND APPARATUS FOR RECORDING MAGNETIC RESONANCE DATA

BACKGROUND OF THE INVENTION

Field of the Invention

The invention concerns a method for recording a magnetic resonance (MR) data record for multiple slices of an acquisition volume of a subject, of the type wherein an imaging technique is utilized that uses reference data in the reconstruction of the magnetic resonance images, wherein, for all the slices, at least two partial data records are recorded with respectively different contrasts with a first partial data record being recorded without a preparation pulse and a second partial data record being recorded with a preparation pulse, in particular an inversion pulse. The invention also concerns a magnetic resonance apparatus, and an electronically readable data storage medium encoded with programming instructions that implement such a method.

Description of the Prior Art

Magnetic resonance imaging has become established for the imaging of patients in the clinical environment. In this context, a large number of different imaging techniques are known with which different diagnostically useful information can be obtained from a region of interest of an examination object, in particular a patient. Apart from the usual different weightings (T1 contrast, T2 contrast, T2* contrast, proton density contrast), a large number of further possibilities has been proposed for obtaining different contrasts in magnetic resonance data. In particular hereby, preparation pulses acting on a respective slice, for example inversion pulses, are used. Readout of the actual echo train that follows with the excitation pulse takes place in a readout window or readout phase or readout module after a particular waiting time. In the case of an inversion pulse, this is the inversion time. The waiting time can have a significant duration, for example, a second or more.

An example of a magnetic resonance sequence extended with a preparation pulse, which provides a particular desired contrast, is the T2-weighted FLAIR sequence (FLAIR=fluid-attenuated inversion recovery). This sequence is designed to suppress magnetic resonance signals of liquids, in particular cerebrospinal fluid (CSF). A typical inversion time (TI) for this contrast is 2.5 seconds.

Since such waiting times generally significantly prolong the duration of the recording, different possibilities for accelerating the overall recording have been proposed, so as to reduce the overall recording time. For example, it is known to use turbo spin echo sequences (TSE sequences), which make it possible by the radiation of repeated refocusing pulses to activate a readout of readout modules following a single excitation pulse (and thus also a single preparation pulse).

A further possibility for accelerating the overall recording is the use of multislice imaging techniques, which are also designated SMS (simultaneous multislice) techniques. The use of such multislice imaging techniques for acceleration has been proposed for the recording of magnetic resonance data records that are to contain partial data records of different contrasts, for example T2 and T2-FLAIR. In this regard, for example, US 2017/0315202 A1 proposes, with the simultaneous recording of two slices, recording one slice on the basis of the radiation of a preparation pulse with one of the contrasts and the other slice, in particular without a preparation pulse, for the other contrast. In a subsequent recording step, the two slices are recorded again simultaneously with swapped contrasts, so that the preparation pulse then acts upon the other slice. Thus, during the recording of magnetic resonance data records with partial data records of different contrasts, a marked acceleration is already achieved, since two repetitions are sufficient to obtain magnetic resonance data for two different slices to be recorded in both desired contrasts. A comparable procedure for a combination of a diffusion contrast and of a T2* contrast by means of the RESOLVE sequence has been proposed in an article by Nora-Josefin Breutigam et al., "Simultaneous Multi-Contrast Imaging with Readout-Segmented EPI", ISMRM 2017.

In order to separate two or more slices recorded simultaneously in SMS imaging, specifically their overlaid ("collapsed") magnetic resonance data, typically the so-called slice-GRAPPA algorithm is used as a separation algorithm, and as described, for example, in the article by Kawin Setsompop et al., "Blipped-Controlled Aliasing in Parallel Imaging (blipped-CAIPI) for Simultaneous Multi-Slice EPI with Reduced g-factor Penalty", Magn Reson Med. 67 (2012), pages 1210-1224. In order to be able to separate particular slices from one another, the separation algorithm for these slices must be parameterized, which means that parameters must be determined in the concrete example of a GRAPPA kernel. The basis for this determination is reference data that have been recorded by the individual, later jointly recorded slices without overlaying.

US 2018/0074147 A1 relates to the problem that the reference data typically recorded with a gradient echo sequence (GRE sequence) does not fit to the magnetic resonance data of the SMS scan later recorded with a TSE sequence. This problem is addressed in this publication by using a TSE-based reference scan to record the reference data, which can be a RARE sequence (rapid acquisition with relaxation enhancement) or a HASTE sequence (half-Fourier acquisition single-shot turbo spin echo). Therefore, the reference data for the whole slice stack covering the capture region is recorded therein in a reference scan before or after the SMS magnetic resonance data recording. Slices which are later recorded jointly are artificially overlaid and corresponding slice-GRAPPA kernels are generated in order to enable the separation of the overlaid magnetic resonance data of the at least two slices.

However, problems arise in the simultaneous multicontrast approach, as disclosed in US 2017/0315202 A1. If the reference data relate to only one of the contrasts while the magnetic resonance data represents two different contrasts in respective partial data records, the reference data does not fit completely at least to the partial data record with altered contrast. This can lead to crosstalk effects between the slices if a false slice separation is undertaken, which in turn negatively influences the image quality.

In the aforementioned conference contribution from Nora-Josefin Breutigam et al., the problem is solved by two separate reference scans being carried out in order to obtain reference data for both contrasts, so that accordingly two sets of parameters for the separation algorithm are also determined. In the configuration therein which concerns mainly the DWI contrast and a conventional T2* contrast, both reference data records can be recorded in a relatively short time since waiting times are shorter with DWI (diffusion-weighted imaging). However, problems arise in the use of contrasts with extremely long waiting times following the preparation pulse, for example in the combination of T2 and T2-FLAIR. Then the recording of respective reference data records for both contrasts would take a very long time due to the long inversion time TI and the repetition time TR of the FLAIR scan.

SUMMARY OF THE INVENTION

An object of the invention is to provide a complete, accelerated recording of reference data for imaging with a number of contrasts.

In the inventive method of the aforementioned type, in order to record the reference data for at least one first slice for the first partial data record, the reference data are recorded during a waiting time after the preparation pulse for at least one other, second slice from which reference data are to be recorded in relation to the second partial data record.

A time-efficient method thus is provided that enables the recording of all the necessary reference data of the different contrasts. Particularly advantageously, for the recording of the reference data, a single-shot TSE sequence is used, preferably a HASTE sequence (half-Fourier acquisition single-shot turbo spin echo). The echo trains associated with such single-shot TSE sequences require a very short time and can therefore be played out in the waiting times, for example inversion times, following the preparation pulses in order therefore while the recording of reference data of the second partial data record in second slices is being awaited, to record reference data of the first partial data record in respective other first slices. In this way, the efficiency of the recording of the reference data is significantly increased. The recording time for the reference data sets is significantly reduced, wherein due to the presence of reference data sets for both partial data records, and therefore both contrasts, a high-quality separation of magnetic resonance data of the overlaid slices in the metacontrast SMS imaging or other high quality in other multicontrast recordings needing reference data is provided.

The present invention can be applied to a large number of different combinations of contrasts wherein preferably a combination of a conventional contrast (therefore without the issuing of a preparation pulse) and a contrast with a long waiting time following the preparation pulse is observed. For example, a T2 weighting and a T2-FLAIR weighting can be used as contrasts, wherein other examples of contrasts using a preparation pulse include STIR (short tau inversion recovery) preparation pulse and diffusion weightings.

In an embodiment of the present invention, in order to record the reference data, preparation pulses for a number of different second slices are radiated successively, wherein in time periods between the output of two preparation pulses and after the output of the last preparation pulse, reference data is recorded in each case for first slices differing from the second slices. A nested recording is therefore conceivable, wherein an echo train for recording reference data of a first slice comes to lie between two preparation pulses or after the last preparation pulse, followed by the corresponding echo trains for recording reference data for the second slices on which the preparation pulses have acted. Since the temporal spacing between the individual preparation pulses for respective individual second slices is dependent on the duration of the echo train after the waiting time TI for the respective second slices, it is possible to provide an additional readout echo train for a first slice between two preparation pulses without significantly increasing the preparation time. In this way, the sequence efficiency can be further significantly increased.

It should be noted that it is naturally suitable, following such a repetition, to provide a further repetition in which the first slices and the second slices are directly swapped, so that, at the end, reference data is present for all the first and second slices of such a repetition.

In an example in which the waiting time TI is 2.5 seconds and a preparation pulse, for example an inversion pulse, lasts 10 ms, in the case of a readout echo train length of approximately 100 ms, reference data are recorded for 22 slices for each contrast within a repetition time TR which then amounts to approximately 5 seconds. In a second repetition time TR, the slices that should be affected by each contrast can be swapped so that for 44 slices, reference data is present for both contrasts. For more slices, for example, more than 44 slices in the example given, further repetitions are needed.

The quantity of data that can be recorded in a single repetition time TR depends upon the waiting time TI between the preparation pulse and the readout echo train, wherein as described, the inversion time for FLAIR can be, for example, approximately 2.5 seconds. However, the method can be applied, in principle to all combinations of conventionally weighted contrasts without a preparation pulse and contrasts prepared by slice-specific preparation pulses, provided the duration of the echo train is shorter than the waiting time. For example, for diffusion-weighted contrasts or STIR, significantly shorter inversion times TI of approximately 220 ms occur.

In another embodiment of the present invention, a multislice imaging technique is used as the imaging technique, thus an SMS imaging technique in which in a recording portion, magnetic resonance data is recorded simultaneously from at least two slices and is assigned to the individual slices by means of a separation algorithm using the reference data of the individual slices. It is advantageous if the procedure described in US 2017/0315202 A1 is used. Therefore, in each joint recording step for two slices, in each case, for one of the slices, magnetic resonance data of the second partial data record are recorded and, for the other slice, data of the first partial data record are recorded, by a preparation pulse acting on this slice. Suitably, in a further repetition, a further execution takes place with swapped slices. Thereby, in particular for determining the parameters of the separation algorithm, the combinations of the reference data for the different contrasts corresponding to the jointly recorded slices are used in each case. For example, for the one slice on which the preparation pulse acts, reference data of this slice relating to the second partial data record are used, while for the other slice, reference data of the first partial data record are used, in order to determine the corresponding slice-GRAPPA kernels. The corresponding reference data are artificially overlaid, taking account of correspondingly occurring slice displacements, and the parameters of the separation algorithm, as is known from the prior art, are determined. If, in a further repetition, the reverse combination of slices is used, the reverse combination of reference data must also then be used in order to obtain the correct slice-GRAPPA kernels.

It should be noted that this method can naturally also be used for SMS acceleration factors of greater than two in that, correspondingly, slices with different contrasts of the reference data are combined. It should also be noted in general that the positions of the slices in the capture region are naturally selected, as is known in principle, such that slice cross-talk between the different contrasts is minimized.

It should further be noted that the method is extremely useful not only for multislice SMS imaging, but also for time-efficient reference data recording for non-SMS multi-contrast imaging techniques which use parallel imaging techniques, such as SENSE or GRAPPA, for accelerating the scan and need reference data for completion of incompletely recorded k-space data in accordance with Nyquist. An example of such multicontrast techniques without multislice formation are MP2RAGE variants.

The invention also encompasses a magnetic resonance apparatus having a control computer configured to operate a scanner of the apparatus so as to implement the method according to the invention. The control computer can have at least one processor and at least one memory. All the embodiments of the method according to the invention apply to the inventive magnetic resonance apparatus with which the aforementioned advantages can therefore also be achieved. Apart from a sequence controller for recording magnetic resonance data/reference data, as is known in principle, the control computer can include a timing unit for determining the time sequences in the recording of the reference data, according to which the sequence controller controls the recording of the reference data.

The present invention also encompasses a non-transitory, computer-readable data storage medium that, when loaded into a computer or computer system of a magnetic resonance apparatus, cause the computer or computer system to operate the magnetic resonance apparatus so as to implement any or all embodiments of the method according to the invention, as described above.

The data carrier can be, in particular, a non-transient data carrier, for example, a CD-ROM.

BRIEF DESCRIPTION OF THE DRAWINGS

FIG. 1 shows a temporal sequence of the recording of reference data according to the present invention.

FIG. 2 shows an echo train which is usable by way of example.

FIG. 3 shows an example for determining parameters of a separation algorithm and their use in the reconstruction of magnetic resonance images.

DESCRIPTION OF THE PREFERRED EMBODIMENTS

Figure 4:
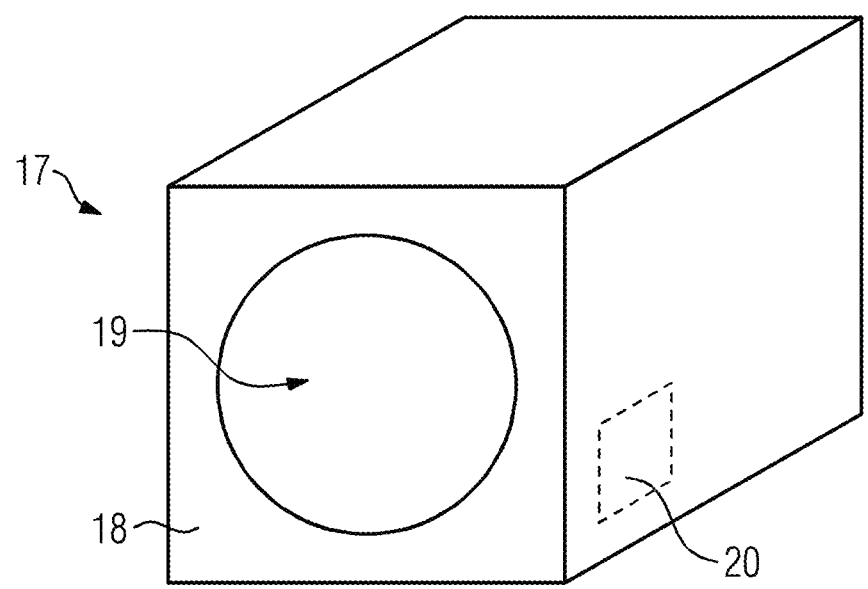
FIG. 4 is a block diagram of an inventive magnetic resonance apparatus.

An exemplary embodiment of the present invention will now be explained, with which, by a multislice imaging technique (SMS imaging), magnetic resonance data are acquired in two partial image records of a capture region of a patient, subdivided into slices. For example, for one recording region in the brain of a patient, a partial image data record can be acquired with conventional T2-weighting, i.e., without a preparation pulse, and a further partial image data record can be acquired with T2-FLAIR weighting, thus with another contrast that requires an inversion pulse as the preparation pulse.

In SMS imaging it is always the case that MR data are acquired from at least two slices simultaneously, wherein a preparation pulse acts on one of the slices, so that magnetic resonance data of the second partial data record are recorded, while for the other slice on which the preparation pulse does not act and for which no preparation pulse is provided, magnetic resonance data of the first partial data record are recorded. In a further repetition, the slices are swapped so that the preparation pulse then acts upon the other slice and from it, magnetic resonance data of the second partial data record are recorded, as described for example in US 2017/00315202 A1. In order to be able to separate the magnetic resonance data of the simultaneously recorded slices reliably and with high quality a separation algorithm is executed, in this case a slice-GRAPPA algorithm, for which reference data without multislice imaging is required for each of the slices in the relevant contrast.

FIG. 1 shows a time sequence of a repetition in which reference data for a number of the slices of the capture region can be recorded.

As shown, preparation pulses 1 are radiated for a number of second slices at a temporal spacing 2 which is set substantially according to the duration 3 of the associated echo trains 4, in the present case using the HASTE sequence. This temporal spacing 2 is now used to place echo trains 5 between the preparation pulses 1 and after the last preparation pulse 1, also using the HASTE sequence in order to record reference data for the first partial image data record for first slices, which differ from the second slices. The number of reference data items recordable in total, thus the number of the first and second slices together, results on the basis of the waiting time 6, in this case the inversion time TI. If the inversion time is that which is typical for T2-FLAIR, for example 2.5 seconds, the radiation of a preparation pulse 1 takes 10 ms and if the length of the readout echo trains 4, 5 is 100 ms, in each repetition of approximately 5 seconds, 22 slices of each contrast, that is in total 44 slices, are recorded. In order to obtain the reference data for the respective other contrasts, that is the respective other partial data records for the first and second slices, in a further repetition according to FIG. 1, the first and second slices are swapped accordingly.

FIG. 2 shows the sequence of an echo train 4, 5 which in the present case involves a single-shot TSE echo train, specifically a HASTE echo train. First an excitation pulse 7 is radiated that is followed by a regular sequence of refocusing pulses 8 and readout time periods 9, indicated by the magnetic resonance signal 10. Through the use of the refocusing pulses 8, a greater number of k-space lines can be scanned.

FIG. 3 illustrates how parameters for the separation algorithm are determined and used in the reconstruction of magnetic resonance images. As mentioned, during the recording of the magnetic resonance data using the SMS imaging of two slices to be recorded simultaneously, one recorded with the T2 contrast, the other with the T2-FLAIR contrast, in a second repetition, conversely the other slice with the T2 contrast and the one slice with the T2-FLAIR contrast. In order to determine the parameter of the separation algorithm for the first repetition, identified in FIG. 3 as I, for the one slice reference data 12 of the first partial data record and for the other slice reference data 11 of the second partial data record are taken into account, so as to generate a combined overlaid data record in a step 13. From this combined data record, a first set of parameters of the separation algorithm, in this case the slice-GRAPPA kernel, is derived in a step 14. Corresponding steps 13, 14 exist as well for the second repetition II in which, however, reference data 16 of the second partial data record are then used for one slice, and reference data 15 of the first partial data record are used for the other slice.

The parameters of the separation algorithm that are obtained, in this case therefore the corresponding slice-GRAPPA kernels, are then applied to overlaid magnetic resonance data 15 recorded in the corresponding repetitions I, II in order to derive magnetic resonance data 16 for the individual slices and partial image data records by execution of the separation algorithm.

Finally, FIG. 4 shows a basic illustration of a magnetic resonance apparatus 17 according to the invention, which includes an MR data acquisition scanner 18 with a basic field magnet, which defines a patient receiving space 19 into which a patient can be moved by a patient support (not shown). A radio-frequency coil arrangement and a gradient coil arrangement are also provided in the scanner 18 surrounding the patient receiving space 19.

The operation of the magnetic resonance apparatus 17 is controlled by a control computer 20, which is configured to implement the inventive method. For this purpose, the control computer 20 can include a sequence controller that controls the recording of magnetic resonance data and reference data, a timing unit that determines recording parameters describing the temporal sequence of FIG. 1 for the sequence controller, and at least one reconstruction processor for the steps according to FIG. 3 and the corresponding reconstruction of magnetic resonance images of the partial data records.

Although modifications and changes may be suggested by those skilled in the art, it is the intention of the Applicant to embody within the patent warranted hereon all changes and modifications as reasonably and properly come within the scope of the Applicant's contribution to the art.

The invention claimed is:

1. A method for operating a magnetic resonance (MR) apparatus, comprising:

with an MR data acquisition scanner, acquiring an MR data record from a region of an examination subject comprising a plurality of slices, by executing an MR data acquisition technique requiring reference data for a reconstruction of MR images from the MR data record, wherein, for all slices in said plurality of slices, at least two partial data records are acquired with respectively different contrasts with a first partial data record being acquired without radiation of a preparation pulse, and with a second partial data record being acquired with a preparation pulse;

operating said MR data acquisition scanner to acquire said reference data for at least one first slice in said first partial data record, recording the reference data thereof during a waiting time after the preparation pulse for at least one other, second slice for which reference data in said second partial data record are acquired; and in a computer, reconstructing said MR images from at least said first partial data record and the reference data therefor and said second partial data record and the reference data therefor, and making said MR images available from the computer in electronic form, as at least one data file.

2. A method as claimed in claim 1 comprising operating said MR data acquisition scanner in the execution of said MR data acquisition technique so as to radiate at least one preparation pulse as an inversion pulse.

3. A method as claimed in claim 1 comprising operating said MR data acquisition scanner to acquire said reference data using a single-shot TSE sequence.

4. A method as claimed in claim 3 comprising using a FLAIR-T2 contrast as a first contrast of said different contrasts, and using a pure T2 contrast as a second contrast in said different contrasts.

5. A method as claimed in claim 1 comprising operating said MR data acquisition scanner to acquire said reference data by radiating respective preparation pulses for each of a plurality of different second slices, and between radiation of each two of said preparation pulses, and after radiating a last of said preparation pulses, acquiring reference data for first slices that differ from said second slices.

6. A method as claimed in claim 1 comprising operating said MR data acquisition scanner to execute a simultaneous multislice imaging technique as said imaging technique, in which said MR data are acquired simultaneously from at least two slices, and reconstructing said MR images using a separation algorithm in which the acquired MR data are assigned to respective individual slices using the reference data of the respective individual slices.

7. A method as claimed in claim 6 comprising, for the multiple acquisition of said MR data simultaneously from at least two slices, for each respective slice in said at least two slices, acquiring MR data of said second partial data record and, for another slice of said at least two slices, acquiring MR data of said first partial data record using said preparation pulse.

8. A method as claimed in claim 7 comprising determining parameters of said separation algorithm by combining the reference data for said at least two slices from which said MR data are simultaneously acquired.

9. A magnetic resonance (MR) apparatus comprising:

an MR data acquisition scanner;

a computer configured to operate said MR data acquisition scanner so as to acquire an MR data record from a region of an examination subject comprising a plurality of slices, by executing an MR data acquisition technique requiring reference data for a reconstruction of MR images from the MR data record, wherein, for all slices in said plurality of slices, at least two partial data records are acquired with respectively different contrasts with a first partial data record being acquired without radiation of a preparation pulse, and with a second partial data record being acquired with a preparation pulse;

said computer being configured to operate said MR data acquisition scanner to acquire said reference data for at least one first slice in said first partial data record, recording the reference data thereof during a waiting time after the preparation pulse for at least one other, second slice for which reference data in said second partial data record are acquired; and said computer being configured to reconstruct said MR images from at least said first partial data record and the reference data therefor and said second partial data record and the reference data therefor, and to make said MR images available from the computer in electronic form, as at least one data file.

10. A non-transitory, computer-readable data storage medium encoded with programming instructions, said storage medium being loaded into a computer of a magnetic resonance (MR) apparatus comprising an MR data acquisition scanner, said programming instructions causing said computer to:

operate said MR data acquisition scanner so as to acquire an MR data record from a region of an examination subject comprising a plurality of slices, by executing an MR data acquisition technique requiring reference data for a reconstruction of MR images from the MR data record, wherein, for all slices in said plurality of slices, at least two partial data records are acquired with respectively different contrasts with a first partial data record being acquired without radiation of a preparation pulse, and with a second partial data record being acquired with a preparation pulse;

operate said MR data acquisition scanner to acquire said reference data for at least one first slice in said first partial data record, recording the reference data thereof during a waiting time after the preparation pulse for at least one other, second slice for which reference data in said second partial data record are acquired; and reconstruct said MR images from at least said first partial data record and the reference data therefor and said second partial data record and the reference data therefor, and make said MR images available from the computer in electronic form, as at least one data file.

* * * * *